United States Patent [19]

Yates, Jr. et al.

[11] Patent Number: 5,286,340
[45] Date of Patent: Feb. 15, 1994

[54] PROCESS FOR CONTROLLING SILICON ETCHING BY ATOMIC HYDROGEN

[75] Inventors: John T. Yates, Jr., Allison Park; Peijun J. Chen; M. Luigi Colaianni, both of Pittsburgh, all of Pa.

[73] Assignee: University of Pittsburgh of the Commonwealth System of Higher Education, Pittsburgh, Pa.

[21] Appl. No.: 759,579

[22] Filed: Sep. 13, 1991

[51] Int. Cl.$^5$ .................. H01L 21/306; B44C 1/22
[52] U.S. Cl. ................... 156/628; 156/657; 148/DIG. 128; 437/937
[58] Field of Search ............. 437/937, 946; 156/628, 156/662, 657; 148/DIG. 34, DIG. 51, DIG. 128

[56] References Cited

U.S. PATENT DOCUMENTS

| | | | |
|---|---|---|---|
| 4,285,762 | 8/1981 | Moustakas | 156/662 |
| 4,361,461 | 11/1982 | Chang | 156/657 |
| 4,601,778 | 7/1986 | Robb | 156/628 |
| 4,880,493 | 11/1989 | Ashby et al. | 156/662 |
| 4,946,735 | 8/1990 | Lee et al. | 156/628 |
| 4,992,134 | 2/1991 | Gupta et al. | 437/937 |

FOREIGN PATENT DOCUMENTS

| | | | |
|---|---|---|---|
| 0042346 | 4/1981 | Japan | 156/628 |
| 0208142 | 12/1982 | Japan | 156/628 |
| 0071632 | 3/1991 | Japan | 156/628 |

Primary Examiner—Tom Thomas
Assistant Examiner—C. Chaudhari
Attorney, Agent, or Firm—Arnold B. Silverman; Suzanne Kikel

[57] ABSTRACT

A process for spatially controlling the etching of a silicon substrate by atomic hydrogen. The process may be generally carried out at room temperature. The process involves implanting a boron dopant in selective portions of the silicon substrate followed by etching with atomic hydrogen. The implanted portions exhibit no etching by atomic hydrogen. A silicon device that is produced by this process is disclosed.

8 Claims, No Drawings

PROCESS FOR CONTROLLING SILICON ETCHING BY ATOMIC HYDROGEN

The invention described herein was made in the course of work supported in part by the Office of Naval Research, Grant No. N00014-91-J-1641 awarded by the Department of the Navy. The Government has certain rights in this invention.

BACKGROUND OF THE INVENTION

1. Field of the Invention

This invention relates to a process for controlling the etching of a silicon substrate by atomic hydrogen and the production of a modified silicon device. More specifically, this process involves implanting a boron dopant into the surface of the silicon substrate and subsequently etching the undoped portions of the substrate with atomic hydrogen.

2. Brief Description of the Prior Art

The incorporation of boron into silicon is well known. Boron is used commonly as a bulk dopant of silicon. Modification of the surface atomic and electronic structure of silicon by foreign atoms such as for example boron, phosphorus or arsenic, is generally known to influence silicon etching mechanisms involving etching reagents other than atomic hydrogen. Etching of the silicon surface by atomic hydrogen involves the removal of surface silicon atoms. The breaking of adatom silicon-silicon backbonds forms silicon dihydride and silicon trihydride species on the silicon surface. These adatom hydrides are believed to be the precursor species for the gas phase etching product, silane ($SiH_4$).

U.S. Pat. No. 3,721,593 discloses a process for stopping the etching action of the etching agent, potassium hydroxide, in liquid phase. The process involves a silicon layer doped with boron.

U.S. Pat. No. 4,601,779 discloses a process that includes forming an etch-stop layer in silicon by implanting boron ions into the silicon. The etchant is a solution of hydrofluoric, nitric and acetic acid.

U.S. Pat. No. 4,131,985 discloses a method of making a semiconductor structure through formation of a semiconductor device on a surface of a polished silicon slice. This patent states that the device may be framed with a diffusion pattern of boron prior to effecting etching using a conventional isotropic etch.

U.S. Pat. No. 4,584,055 discloses a method of manufacturing a semiconductor device which includes doping an impurity ion, such as boron, into a semiconductor layer and subsequently etching the semiconductor layer using potassium hydroxide or amine, pyrocatechol and water as an etchant. This patent states that the etching rate is extremely low in portions where the boron ion is highly doped.

U.S. Pat. No. 4,313,773 discloses a method of boron doping a silicon body wherein the silicon body is exposed to a gas mixture containing $BBr_3$ and oxygen prior to etching. This method uses hydrofluoric acid diluted with water and then aqueous sulfuric acid/potassium permanganate solution as an etchant.

U.S. Pat. No. 4,092,209 discloses a method for rendering a surface of a body of silicon unetchable that includes bombarding the silicon surface with phosphorus or boron. This patent states that it is known that the etch rate is substantially reduced when boron is placed in the silicon semiconductor by solid-to-solid diffusion, gaseous diffusion or ion implantation. The etching reagent is potassium hydroxide solution.

U.S. Pat. No. 4,718,973 discloses a method for implanting a dopant such as phosphorus or arsenic within a polysilicon layer such that the dopant is heavily concentrated at the polysilicon surface. This patent states that plasma etching is subsequently performed by using a mixture of a fluorine and chlorine etchant gas, and that the implanted regions are protected from etching.

In spite of these prior art disclosures, there remains a very real and substantial need for a process for the spatially selective gas phase dry etching of silicon with atomic hydrogen. None of the prior processes involves the use of atomic hydrogen as the etching reagent.

SUMMARY OF THE INVENTION

The present invention has met the above-described need. A process for treating a silicon substrate using the present invention provides an efficient and economical chemical modification of a silicon surface that effectively controls etching with atomic hydrogen.

The process for treating a silicon substrate of this invention includes implanting a boron dopant in portions of the surface of the silicon substrate and effecting etching with atomic hydrogen of the portions of the silicon substrate not treated with the boron dopant.

The silicon substrate of this invention includes a silicon surface and a boron dopant implanted within portions of the silicon surface. The boron doped portions of the silicon surface are resistant to etching with atomic hydrogen.

It is an object of the present invention to provide a process for treating a silicon substrate to achieve selective etching with atomic hydrogen.

It is another object of the present invention to provide a process for treating a silicon substrate that includes implanting a boron dopant in selective portions of the surface of the silicon wafer before effecting etching with atomic hydrogen.

It is a further object of the present invention to provide a silicon device having portions of the silicon surface that are resistant to etching with atomic hydrogen.

These and other objects of this invention will be more fully understood from the following description of the invention and the claims appended hereto.

DESCRIPTION OF THE PREFERRED EMBODIMENTS

As used herein, the term "adatom" means an atom in the surface of a silicon substrate which is incompletely bound to the silicon bulk by less than four valencies.

As used herein, "silicon" means (a) substantially pure silicon, (b) silicon with suitable alloying agents, and (c) silicon having impurities ranging to the upper limits tolerable in light of the end use application.

The silicon device and process of this invention provide for the boron doping of portions of a silicon substrate such that the boron doped portions of the silicon substrate are resistant to etching by atomic hydrogen.

The process for treating a silicon substrate of this invention includes implanting a boron dopant into portions of the surface of the silicon substrate, and effecting etching with atomic hydrogen of portions of the silicon substrate not treated with the boron dopant. This procedure supplies a low temperature spatially-controlled etching process, operating generally at room temperature, about 300K.

This process preferably includes employing a focused boron implantation source for selectively implanting the boron dopant in portions of the silicon substrate wherein it is designed to resist etching by atomic hydrogen. It will be understood by those skilled in the art that the implantation of boron is effected with sufficient depth and flux to provide a silicon surface having boron doped portions with sufficient resistance to the atomic hydrogen etchant. Such implantation sources and manner of effecting such control of boron doping are well known by those skilled in the art. Also, this process includes producing the atomic hydrogen by dissociating hydrogen gas ($H_2$). During the etching process, silane gas ($SiH_4$) is generated at the surface of the silicon substrate being etched. This process preferably includes employing a silicon substrate surface and effecting the implantation so as to introduce a boron atom underneath each of the silicon adatoms where etching is to be suppressed.

It will be appreciated by those skilled in the art that this process may be advantageously employed in the creation of a silicon semiconductor device.

In another embodiment of this invention, a silicon device has a silicon surface to be treated, and a boron dopant implanted within portions of the silicon surface. These boron doped portions are characterized as being resistant to etching with atomic hydrogen. The surface of the silicon device of this invention includes portions having silicon adatoms having boron atoms underneath the silicon adatoms. The implantation of the boron dopant within portions of the silicon surface is effected with a focused implantation source. The atomic hydrogen is dissociated hydrogen gas. It will be understood by those skilled in the art that the silicon device of this invention comprises a semiconductor device.

Temperature programmed desorption experiments from the boron modified surface of this invention were carried out at different atomic hydrogen exposures and both $H_2$ and $SiH_4$ desorption were monitored. These experiments show that in comparison to a clean unmodified silicon surface, the boron modified silicon surface exhibited a substantially lower reactivity with atomic hydrogen. The major differences that were found to exist for the boron modified silicon surface when compared to the clean unmodified silicon were as follows: (1) no silane gas production was detected by temperature programmed desorption following the atomic hydrogen exposures; (2) hydrogen gas thermal desorption forms only a single desorption state at approximately 730 Kelvin (K). This is in contrast to the formation of additional lower temperature hydrogen desorption states on the clean unmodified silicon surface; and (3) the total hydrogen gas desorption yield on the boron modified silicon surface was significantly lower.

The absence of silane desorption clearly indicates a lack of etching during temperature programming of the atomic hydrogen saturated boron modified silicon surface. The lack of etching on the boron modified silicon surface and the absence of the low temperature hydrogen desorption states indicate that the formation of dihydride and trihydride species is severely hindered; these higher hydrides are known to be the precursors for silane gas production. By contrast, on the clean unmodified silicon surface, etching by atomic hydrogen readily occurred. This etching phenomenon was consistent with the detection of silane desorption in the temperature range of about 400 to 650K in the temperature programmed desorption experiments on the clean unmodified silicon on which hydrogen atoms have been adsorbed.

Vibrational spectroscopy was carried out to identify the surface hydride species. The high resolution electron energy loss (HREEL) spectra obtained following an atomic hydrogen gas exposure on a clean unmodified silicon surface showed that mono- and dihydride species were fully developed. In contrast, following more extensive atomic hydrogen exposure on the boron modified silicon surface, only a weak silicon-hydrogen monohydride stretching mode was observed. This lower spectroscopic intensity silicon-hydrogen stretching mode on the boron modified silicon surface was consistent with the observed lower hydrogen gas desorption yield on this modified surface. This indicates that substantially no higher hydride species were present on the boron modified silicon surface.

It will be appreciated by those skilled in the art that the experiments indicate that the boron modified silicon surface of this invention is substantially unreactive toward atomic hydrogen and that atomic hydrogen etching does not occur in boron doped portions of this modified silicon surface. As a result, it will be understood that the spatial control of atomic hydrogen etching of a silicon surface may be effected by selectively implanting boron in the silicon surface.

A brief description of the experiment showing that boron doping suppresses atomic hydrogen etching of silicon is hereinafter provided.

EXAMPLE

This experiment was performed in a stainless steel ultra high vacuum system with a typical base pressure of $1 \times 10^{-10}$ torr. The silicon crystal used was a $1.3 \times 1.3 \times 0.15$ centimeter, p-type boron-doped (10 ohm centimeter nominal resistivity) wafer oriented to within 1° of the silicon(111) direction. The crystal mounting and initial cleaning procedures employed are well known to those skilled in the art. The in situ cleaning of the silicon crystal was achieved by 2.5 keV $Ar^+$ sputtering at a 60° incidence angle followed by annealing at 1200 Kelvin. Atomic hydrogen was produced by dissociating $H_2$ gas at $5 \times 10^{-7}$ torr with a hot tungsten spiral filament (diameter 1.9 centimeter; temperature = 1800–1900 Kelvin) placed approximately 4 centimeters in front of the silicon(111) crystal. As the arrival rate of atomic hydrogen at the silicon surface was unknown, the $H_2$ exposures were expressed in units of Langmuirs (L), ($1L = 10^{-6}$ torr sec). $H_2$ exposures were measured with an uncorrected Bayard-Alpert ionization gauge. During atomic hydrogen exposure, the liquid-$N_2$ (nitrogen) cooled silicon(111) sample temperature was stabilized at a temperature of approximately 310 Kelvin.

The boron-modified silicon(111) surface preparation involved adsorbing decaborane (DB), $B_{10}H_{14}$, at room temperature and subsequent annealing to 1200 Kelvin to facilitate inward boron diffusion and the desorption of excess hydrogen and boron.

It will be appreciated by those skilled in the art that this procedure provides a process for treating a silicon substrate that may then be tested for etching with atomic hydrogen. It will be understood that the chemical modification employed in this invention involves the use of a boron dopant incorporated in the silicon subsurface portions. Etching with atomic hydrogen occurs in portions of the silicon substrate not treated with the boron dopant. The portions of the silicon surface treated with the boron dopant are characterized as being resistant to etching with atomic hydrogen.

Whereas particular embodiments of this invention have been described herein for purposes of illustration, it will be evident to those skilled in the art that numerous variations of the details of the present invention may be made without departing from the invention as defined in the appended claims.

We claim:

1. A process for treating a silicon substrate which comprises:
    selectively implanting a boron dopant in portions of the surface of said silicon substrate; and
    effecting etching of the silicon substrate portions not treated with said boron dopant by applying atomic hydrogen to the surface of said portions and resisting etching by said atomic hydrogen of said portions of said silicon substrate treated with said boron dopant.

2. The process of claim 1 including effecting said treatment on said silicon substrate which is a silicon semiconductor.

3. The process of claim 1 including employing a focused implantation source for implanting said boron dopant within said portions of said silicon substrate.

4. The process of claim 3 including producing said atomic hydrogen by dissociating hydrogen gas.

5. The process of claim 4 including during said etching generating silane gas at said portions of said silicon substrate being etched.

6. The process of claim 1 including employing as said silicon substrate a substrate having a surface that includes silicon adatoms, and effecting said implantation so as to introduce boron atoms underneath said silicon adatoms.

7. The process of claim 6 including effecting bonding of said boron atoms to said silicon adatoms.

8. The process of claim 1 including effecting said etching at a temperature of about 300K.

* * * * *